US 9,000,558 B2

(12) United States Patent
Sarfaraz et al.

(10) Patent No.: US 9,000,558 B2
(45) Date of Patent: Apr. 7, 2015

(54) WAFER-LEVEL FLIP CHIP PACKAGE WITH RF PASSIVE ELEMENT/ PACKAGE SIGNAL CONNECTION OVERLAY

(75) Inventors: Ali Sarfaraz, Alamo, CA (US); Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 640 days.

(21) Appl. No.: 12/534,640

(22) Filed: Aug. 3, 2009

(65) Prior Publication Data

US 2010/0181642 A1     Jul. 22, 2010

Related U.S. Application Data

(60) Provisional application No. 61/145,596, filed on Jan. 19, 2009.

(51) Int. Cl.
*H01L 23/485*     (2006.01)
*H01L 23/522*     (2006.01)
*H01L 23/31*     (2006.01)

(52) U.S. Cl.
CPC ........ *H01L 23/5227* (2013.01); *H01L 23/5223* (2013.01); *H01L 23/3114* (2013.01); *H01L 2224/05569* (2013.01); *H01L 2224/0401* (2013.01); *H01L 2224/05558* (2013.01); *H01L 2224/05572* (2013.01)

(58) Field of Classification Search
USPC .......... 257/508, 692, 786, E23.141, E23.143, 257/E23.151, E27.026
See application file for complete search history.

(56) References Cited

U.S. PATENT DOCUMENTS

| | | | |
|---|---|---|---|
| 6,232,662 B1* | 5/2001 | Saran | 257/750 |
| 6,800,936 B2* | 10/2004 | Kosemura et al. | 257/748 |
| 2007/0025092 A1* | 2/2007 | Lee et al. | 361/761 |
| 2007/0188997 A1* | 8/2007 | Hockanson et al. | 361/760 |
| 2008/0157340 A1* | 7/2008 | Yang et al. | 257/691 |
| 2008/0268828 A1* | 10/2008 | Nagaraja | 455/419 |
| 2009/0309235 A1* | 12/2009 | Suthiwongsunthorn et al. | 257/777 |
| 2010/0059853 A1* | 3/2010 | Lin et al. | 257/528 |

* cited by examiner

*Primary Examiner* — Wensing Kuo
(74) *Attorney, Agent, or Firm* — Garlick & Markison; Edward J. Marshall

(57) ABSTRACT

A packaged integrated circuit includes an integrated circuit having a Radio Frequency (RF) passive element formed therein and a wafer level chip scale flip chip package that contains the integrated circuit. The wafer level chip scale flip chip package includes at least one dielectric layer isolating a top metal layer of the integrated circuit and a package signal connection upon the at least one dielectric layer, wherein the package signal connection partially overlays the RF passive element with respect to a surface of the integrated circuit. The RF passive element may be an inductor, a transformer, a capacitor, or another passive element. The package signal connection may be a conductive ball, a conductive bump, a conductive pad, or a conductive spring, for example. A conductive structure may reside upon the at least one dielectric layer to provide shielding to the RF passive element and may include a plurality of conductive elements or a mesh.

20 Claims, 12 Drawing Sheets

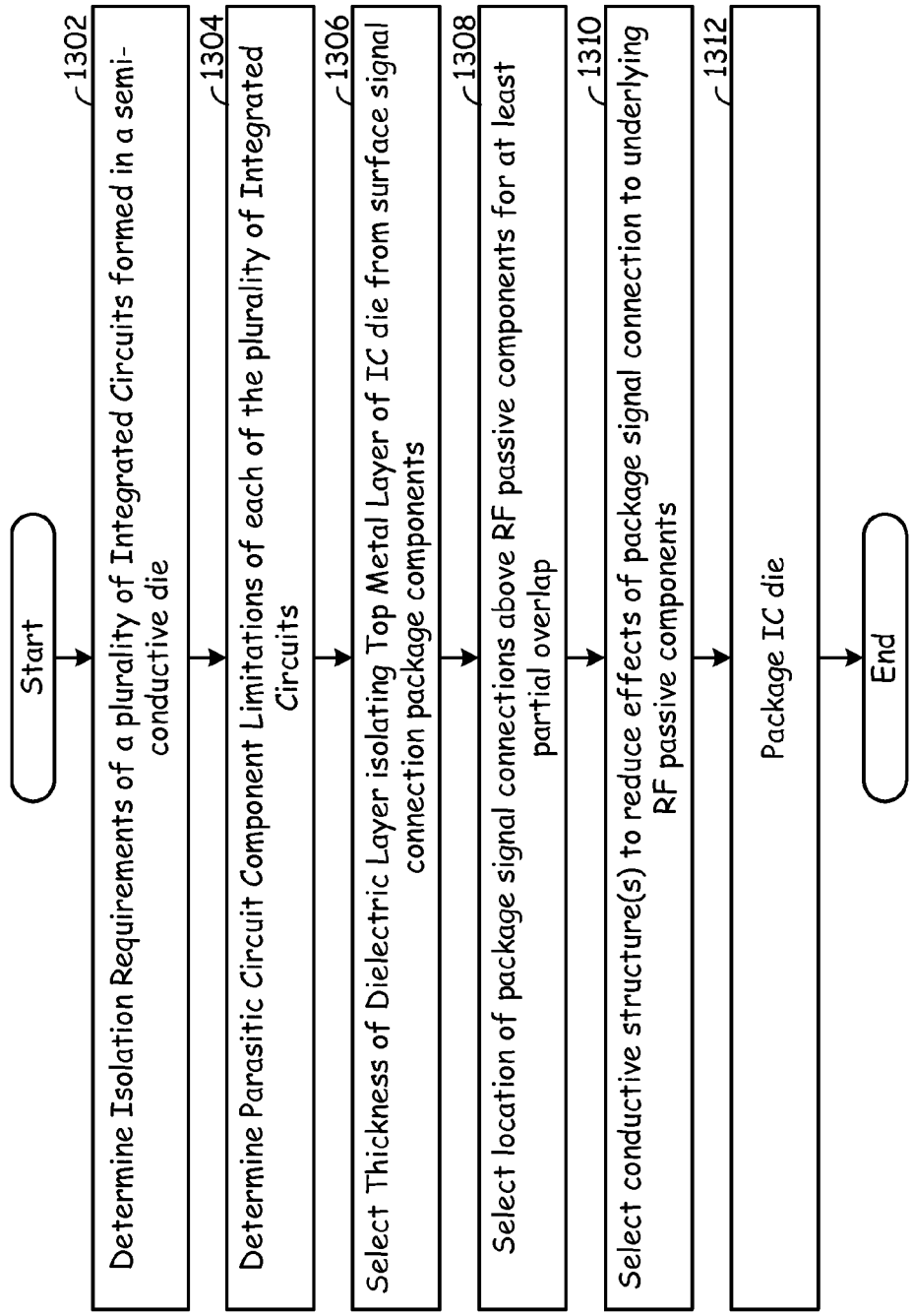

WAFER-LEVEL FLIP CHIP PACKAGE WITH RF PASSIVE ELEMENT/ PACKAGE SIGNAL CONNECTION OVERLAY

CROSS REFERENCES TO RELATED APPLICATIONS

The present application claims priority under 35 U.S.C. 119(e) to U.S. Provisional Application Ser. No. 61/145,596, filed Jan. 19, 2009, and having a common title with the present application, which is incorporated herein by reference in its entirety for all purposes.

BACKGROUND OF THE INVENTION

1. Technical Field of the Invention

This invention relates generally to integrated circuit design and packaging; and more particularly to input/input output connections for packaged integrated circuits.

2. Description of Related Art

The manufacture, packaging, and use of integrated circuits is generally known. A manufacturing process within a fabricating facility is used to form a unit number of integrated circuits on a single semiconductive substrate. After formation, the semiconductive substrate is divided into the unit number of integrated circuits, i.e., dies. The dies are then packaged. The package provides protection for the integrated circuit die and provides electrical connections between the integrated circuits formed on the die and package pads. The packaged dies are then usually mounted upon printed circuit boards (PCBs) and installed into host devices. The PCBs include conductors that communicatively couple the circuits of the integrated circuit with circuits of other integrated circuits, with PCB connectors, and with user interface devices, etc. As manufacturing process dimensions continue to decrease, larger numbers of circuits are formed on ever-smaller dies. In order to reduce the overall size of the PCBs upon which the packaged dies are mounted, packages having reduced dimensions have been developed. One type of integrated circuit package is referred to as a "wafer-level package. With a wafer-level package, the size of the package is substantially the same as the size of the die contained within. In one particular type of wafer-level package, package surface located package signal connections, e.g., bumps/balls/pads of the wafer-level package serve as the electrical interface between the electrical connections of the package and the PCB upon which it mounts and/or other circuitry.

The bumps/balls/pad placed on the top metal layer of the integrated circuit provides the means of electrical connection between the integrated circuit input output circuitry and off-chip components, e.g., a package substrate and/or PCB circuitry. However, as integrated circuit area decreases, input/output density increases, the density of input/output bumps/balls/pads arrays increases. With a denser I/O bump/ball/pad array, it is more difficult to eliminate bump/ball/pad overlap with underlying critical circuitry, causing unavoidable interference that affects proper device operation. Thus, a need exists for wafer-level packaging that satisfies the circuit requirements of the integrated circuits formed on the die.

BRIEF SUMMARY OF THE INVENTION

The present invention is directed to apparatus and methods of operation that are further described in the following Brief Description of the Drawings, the Detailed Description of the Drawings, and the Claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 13 is a flow chart illustrating a method for constructing a wafer-level chip scale flip chip package according to an embodiment of the present invention.

DETAILED DESCRIPTION OF THE INVENTION

Figure 1:
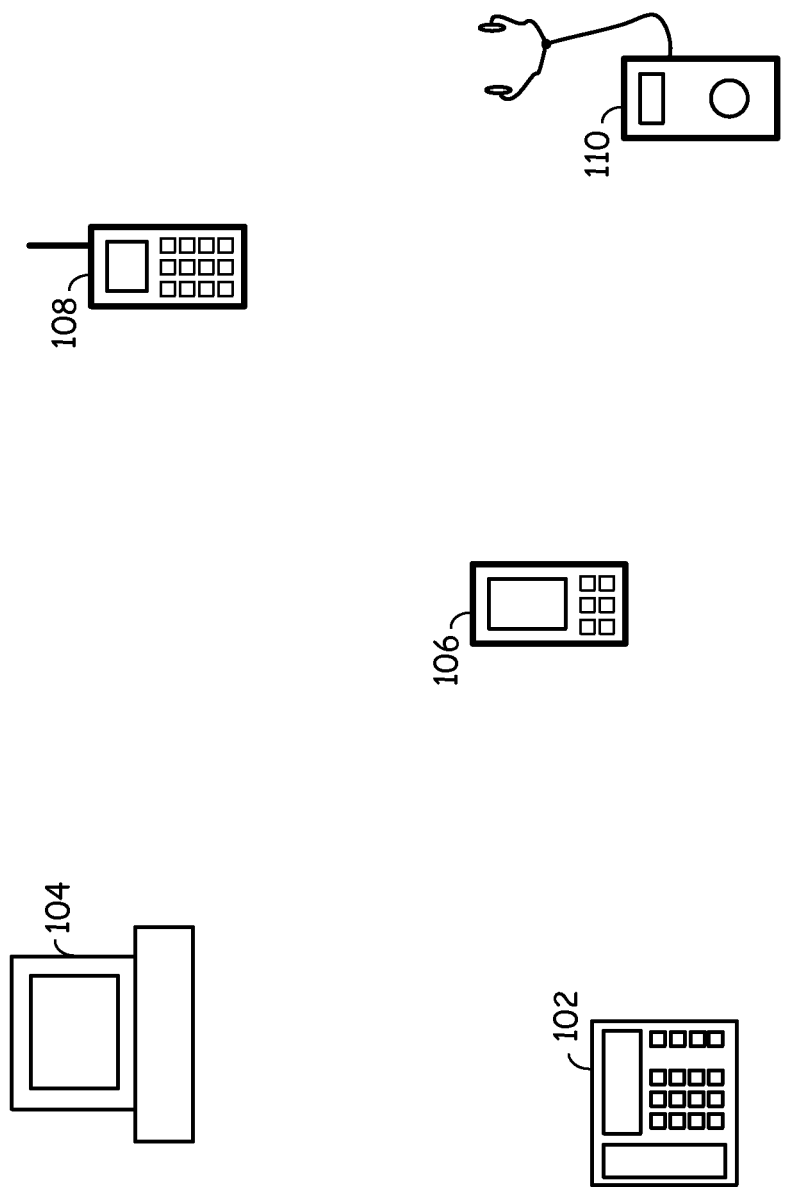
FIG. 1 is a diagram illustrating examples of devices that contain integrated circuits packaged according to the present invention.

FIG. 1 is a diagram illustrating examples of devices that contain integrated circuits packaged according to embodiments of the present invention. A telephone 102, a computer 104, a Personal Data Assistant (PDA) 106, a wireless handset 108, e.g., wireless voice terminal, GPS receiver device, etc., and an MP3 player 110 each contain one or more Integrated Circuits (ICs) packaged according to the present invention. Some of these devices such as the PDA 106, wireless handset 108, and the MP3 player 110 may have severe space limitations that require a small foot print Printed Circuit Board (PCB) that hosts one or more packaged ICs. A wafer-level flip chip package formed according to the present invention is substantially the same size as the IC die it contains. Thus, a device containing a PCB upon which IC packages constructed according to the present invention mount may have a much-reduced physical size. Of course, other devices than those shown may include a wafer-level flip chip package formed according to one or more embodiments of the present invention.

Various devices that embody the present invention may include Radio Frequency (RF) communication circuitry. This RF communication circuitry may include passive RF circuit structures, such as capacitors, inductors, resistors, etc. that are used in RF circuits. These RF circuits may include radios, tuners, power amplifiers, voltage controlled oscillators and other circuitry. Such circuitry may be present in analog and mixed signal circuit blocks.

Figure 2:
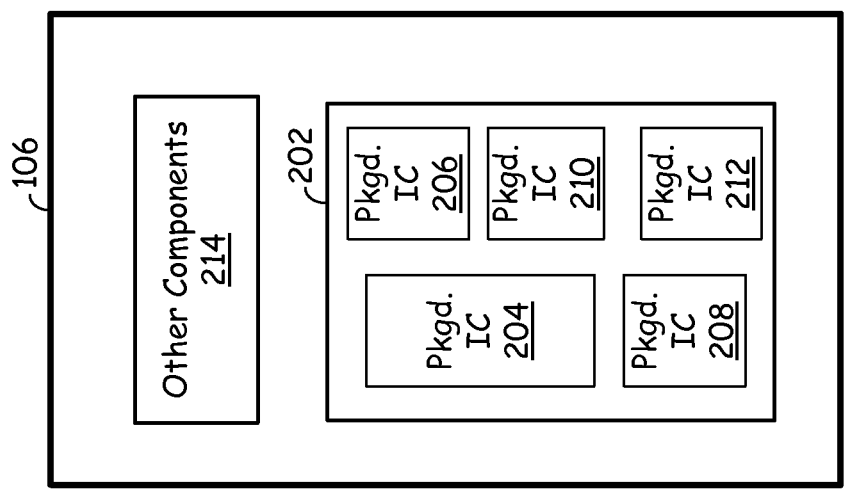
FIG. 2 is a block diagram illustrating a plurality of integrated circuit packages constructed according an embodiment of the present invention that are contained within the PDA of FIG. 1.

FIG. 2 is a block diagram illustrating a plurality of integrated circuit packages constructed according to an embodiment of the present invention that are contained within the PDA (or other device) of FIG. 1. The PDA 106 contains a printed circuit board (PCB) 202 upon which the plurality of IC packages mount. The PDA 106 also includes other components 214 such as a keypad interface, a display, a battery, and an audio interface. The other components 214 couple to PCB 202 via electrical connections.

The PCB 202 has mounted thereon a plurality of wafer-level flip chip IC packages constructed according to one or more embodiments of the present invention. Each of these IC packages 204-212 includes an IC die having circuitry contained thereon that performs particular respective processing functions for the PDA 106. The PCB 202 communicatively couples the plurality of packaged ICs 206-212 and provides a physical surface upon which they mount.

The embodiment of FIG. 2 illustrates one structure for forming a host device according to the present invention. In another structure, the PDA 106 may have a fewer number of packaged ICs or a greater number of packaged ICs. In another structure, the PDA 106 may have multiple PCBs and other components.

Referring to both FIGS. 1 and 2, the telephone 102, the computer 104, the wireless handset 108, and the MP3 player 110 may have a structure similar to the structure of PDA 106. In such case, each of these devices would house ICs packaged according to the present invention. Some devices, such as voice terminal 108 include ICs that service a wireless interface between the voice terminal 108 and other devices using Radio Frequency (RF) communications. These RF ICs include RF passive (and active) components formed in multiple metal layers of the IC or in semi conductive layers of the IC. The IC packages that package these RF ICs (that include these components) may interfere with the operation of the RF passive components of the IC. While packaging has some influence upon the operation of all ICs packaged therein, the IC package may a greater effect on the RF passive components of the RF ICs. Thus, according to the present invention, which will be described further with reference to FIGS. 3-13, an IC package meets the isolation requirement, parasitic circuit limitation requirements, and other circuit requirements of the ICs of the die contained by the IC package.

Figure 3:
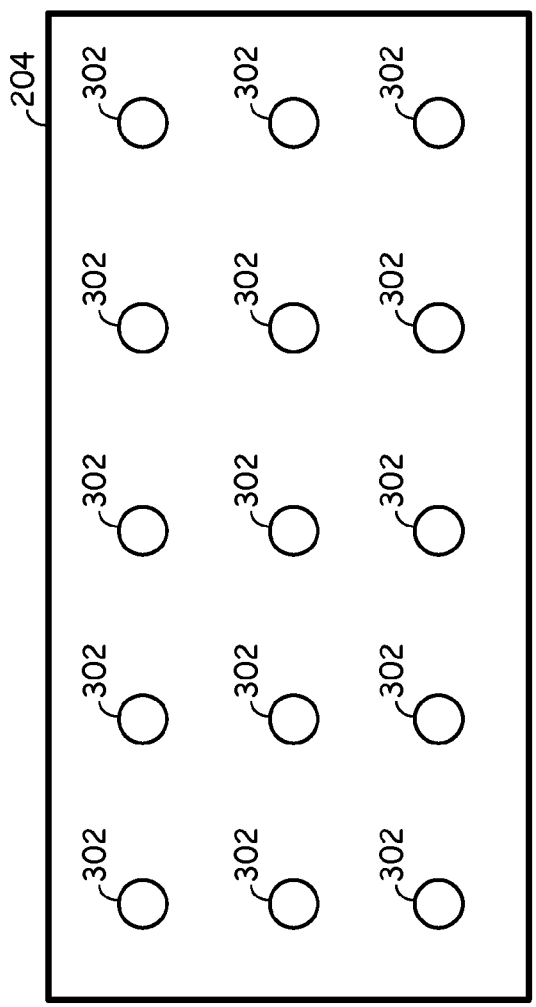
FIG. 3 is a diagrammatic bottom view of an integrated circuit package formed according to an embodiment of the present invention.

FIG. 3 is a diagrammatic bottom view of an integrated circuit package formed according to an embodiment of the present invention. This type of IC package 204 is referred to herein as a wafer-level flip chip package. The IC package 204 includes, among other structure, a plurality of package signal connections 302. The package signal connections 302 may be formed of metal, e.g., solder, that may be bonded to electrical connections of a PCB 202 upon which the packaged IC 204 mounts. With some embodiments of the present invention, the package signal connections are bumps and with other embodiments the package signal connections are balls. With still other embodiments, the package signal connections are metal columns, springs, or other contacts. These package signal connections 302 communicatively couple to the ICs of the packaged IC die via conductors formed in the IC package, pads formed on the IC die, and conductors formed within the IC die.

Figure 4:
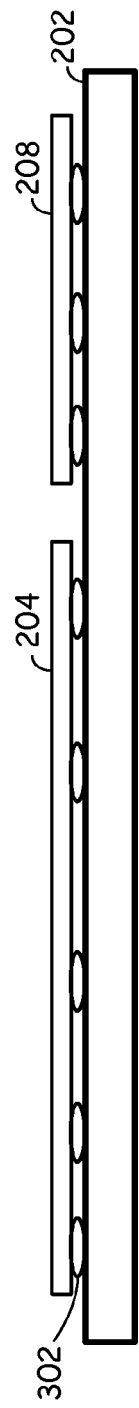
FIG. 4 is a diagrammatic side view of a Printed Circuit Board (PCB) upon which a plurality of integrated circuit packages formed according to an embodiment of the present invention mount.

FIG. 4 is a diagrammatic side view of a Printed Circuit Board (PCB) upon which a plurality of integrated circuit packages formed according to an embodiment of the present invention mount. With the embodiment of FIG. 4, the packaged IC 204 mounts upon PCB 202 by applying sufficient heat to melt the metal bumps/balls 302 such that they affix to conductive pads of the PCB 202. The PCB 202 includes, in addition to the pads to which the bumps/balls 302 affix, dielectric layers, conductors formed upon and between the dielectric layers, and vias that pass through the dielectric layers and couple to the conductors. The PCB 202, as was previously described, provides electrical connections between the packaged ICs 204 and 208, as well as between the packaged ICs 204 and 208 and connectors (not shown) mounted upon the PCB. The package signal connections could be affixed to the conductive pads of the PCB 202 using other techniques as well, such as adhesive techniques or thermo mechanical bonding, among other techniques.

Figure 5:
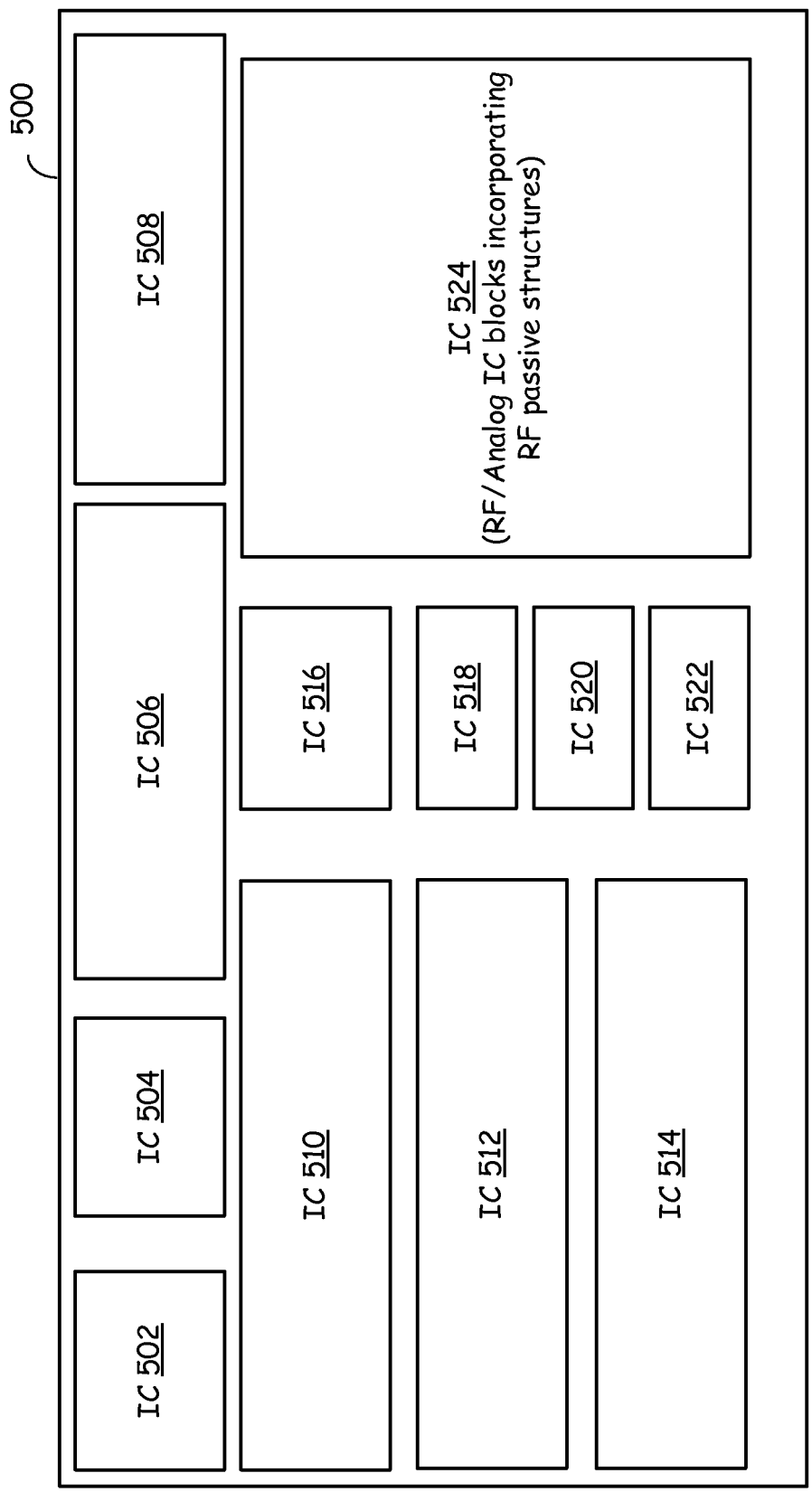
FIG. 5 is a block diagram illustrating an integrated circuit that may be packaged according to an embodiment the present invention.

FIG. 5 is a block diagram illustrating an integrated circuit that may be packaged according to one or more embodiments of the present invention. IC die 500 includes a plurality of ICs 502-524. As is generally known, an IC die 500 may have a plurality of ICs 502-524 formed thereon, each with unique operational characteristics/functions. IC 500 for example services RF communications with IC 524 including RF/analog IC blocks that incorporate RF passive structures while other ICs of the IC die 500 do not include such components. According to the present invention, the IC package packages the IC die 500 to meet the isolation requirements, parasitic circuit limitations, and other limitations of each of the ICs 502-524 formed on IC die 500. According to another aspect of the present invention, the IC package has respective differing structure that meets differing isolation requirements, different parasitic circuit limitations, and other circuit limitations of each of ICs 502-524. In particular, according to some aspects of the present invention, bumps/balls of the package are located based upon the location of underlying circuit structures such as RF passive structures. These aspects will be further described herein with reference to FIGS. 6-13.

Figure 6:
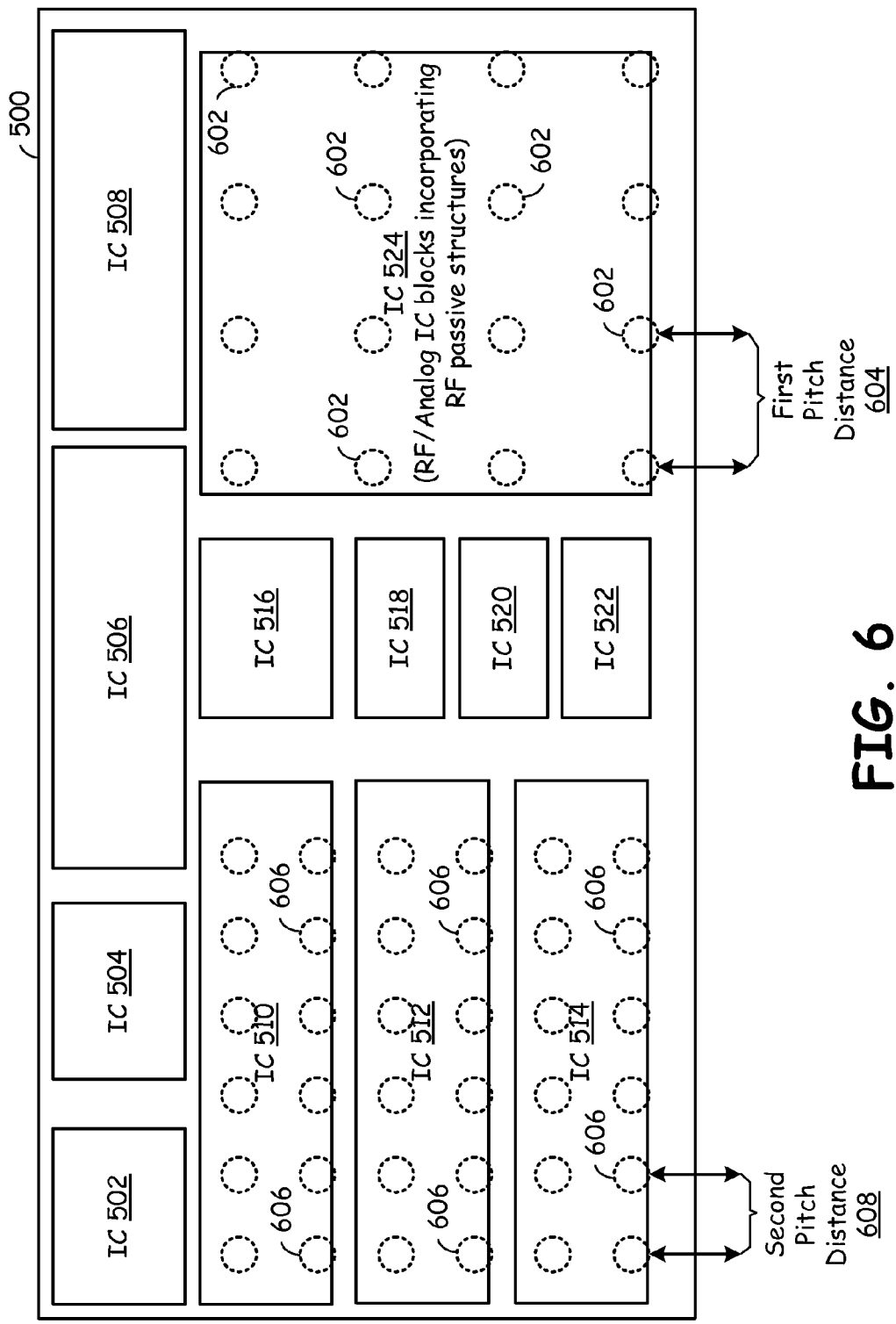
FIG. 6 is a diagrammatic transparent top view of a wafer-level flip chip package containing the integrated circuit of FIG. 5 and constructed according to an embodiment of the present invention.

FIG. 6 is a diagrammatic transparent top view of a wafer-level flip chip package constructed according to an embodiment of the present invention. The IC die 500 includes the plurality of ICs 502-524 and servicing package signal connections 602 and 606 of the IC package. The package signal connections 602 and 606 provide connectivity between PCB pads and pads of the IC die 500. According to one aspect to the present invention, a pitch distance between package signal connections of the IC package varies based upon the characteristics of underlying ICs. For example, IC 524 includes inductive components that require particular minimum isolation from package signal connections 602. Therefore, the package signal connections 602 that overlay IC 524 have a first pitch distance 604. ICs 510, 512 and 514 have lesser isolation requirements that are not as severe as those of IC 524. Because of this lesser isolation requirement, a second pitch distance 608 (less than the first pitch distance 604) between the package signal connections 606 that overlay ICs 510, 512, and 514 is used.

According to another aspect of the present invention the package signal connections are located based, generally, with respect to a surface of the IC and package surface, upon the location of underlying RF circuit components. For example, the package signal connections 602 of the IC 524 are located based upon the location of underlying RF circuit components. Likewise, the underlying RF circuit components may be located based upon the package signal connection requirements of the IC 524. According to one particular aspect of the present invention, at least one of the package signal connections, e.g., bumps/balls/pads, springs, other electrical connection, at least partially overlay an underlying RF circuit component. Particular examples of such structures will be described further herein with reference to FIGS. 7 through 12.

Figure 7:
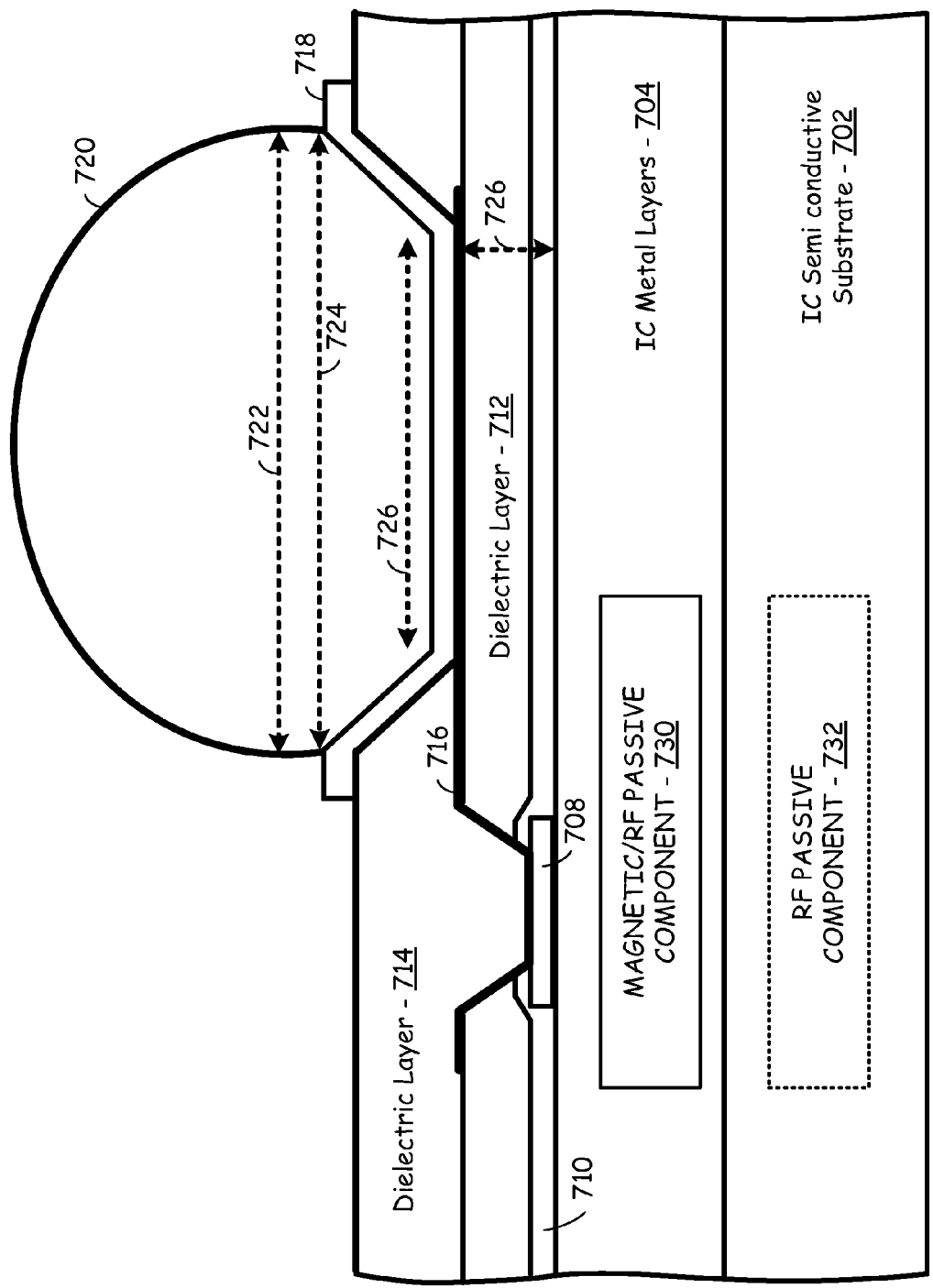
FIG. 7 is a diagrammatic sectional side view of a portion of an integrated circuit package constructed according to an embodiment of the present invention.

FIG. 7 is a diagrammatic sectional side view of a portion of an integrated circuit package constructed according to an embodiment of the present invention. An IC semiconductive substrate 702 has ICs formed there upon and therein. Residing upon the IC semiconductive substrate 702 are a plurality of IC metal layers 704 that provide communication connectivity between/among the circuits formed in the semiconductive substrate 702. This structure is conventional and generally known. Formed upon a top IC metal layer (of the IC metal layers 704) is a signal pad 708. The signal pad 708 communicatively couples to one or more conductors formed the IC metal layers 704. A dielectric layer 710 is formed above the IC metal layers 704 and the signal pad 708 to protect the IC metal layers 704. An opening is formed in the dielectric layer 710 to allow access to the signal pad 708.

The wafer-level flip chip package of FIG. 7 includes a first dielectric layer 712 formed upon the insulation layer 710 of semiconductive die. The wafer level flip chip package further includes a redistribution layer (RDL) conductor corresponding to the signal pad 708 that is formed upon the dielectric layer 712. Formed above the RDL 716 is a dielectric layer 714 that provides electrical isolation and protection for the UBM 716 and protection for underlying components. Under bump metallization (UBM) layer 718 is formed within an opening in the dielectric layer 714, electrically couples to RDL 716, and provides a location for bump/ball 720. Bump/ball 720 is formed upon the UBM layer 718, includes a base dimension 726, a pad size dimension 724, and a bump/ball diameter 722. Note that a bump may have a cylindrical structure as contrasted to the ball structure illustrated. Further, a spring or other conductive structure would differ from the illustrated ball structure. Generally, the package signal connections will have same/similar/differing constructs depending upon their package signal connection type.

The thickness of dielectric layers 712 and 714 is selected to satisfy particular isolation requirements of ICs formed in the IC semiconductive substrate 702 and IC metal layers 704. The thickness of dielectric layer 712 and dielectric layer 710 are represented by distance 726 in FIG. 7 and is selected according to the present invention to meet the isolation requirements of the ICs. According to one embodiment of the present invention, a combined thickness of dielectric layers 710, 712, and 714 has a minimum thickness. Using processing techniques available at the time of filing of this application, this thickness is at least ten (10) micrometers (μm). The IC package of FIG. 7 may include additional components as well such as a protective insulation layer adjacent IC semiconductive substrate 702.

According to another aspect of the present invention (as will be further illustrated herein with reference to FIGS. 9-12, one or more magnetic/RF passive components 730 may be formed in the IC metal layers 704. Further, one or more RF passive components 732 may be formed in the IC semiconductive substrate layer 702. For example, the magnetic/RF passive component(s) 730 may include inductors, transformers, capacitors, and/or other RF passive elements. Further, the RF passive components 732 of the IC semi conductive substrate layer 702 may be resistors, capacitors, or other RF passive elements.

According to one aspect of the present invention, the package signal connections have a cross-sectional area with respect to a surface of the IC/package. Further, each of the RF passive components 730 and 732 have a cross-sectional area with respect to the surface of the IC/package. With regard to one aspect of the present invention, the cross sectional areas of the package signal connection, e.g., ball 720, at least partially overlays a cross-sectional area of one or both of RF passive components 730 and/or 732. Because of this at least partial overlay/overlap, the conductive properties of the package signal connection may interfere with operation of the RF passive components 730 and/or 732. Thus, the partial overlay/overlap must be selected so that such interference does not diminish or affect operation of the RF passive components 730 and/or 732 to the extent that operation of corresponding circuitry is precluded or degraded to an unacceptable level. Thus, according to some aspects of the present invention, the overlay/overlap is selected to avoid such unacceptable operational effects. Further, as will be described further with reference to FIGS. 10, 11, and 12, protective structures may be formed to reduce the effect of the package signal connection(s) to the underlying RF passive components.

Figure 8:
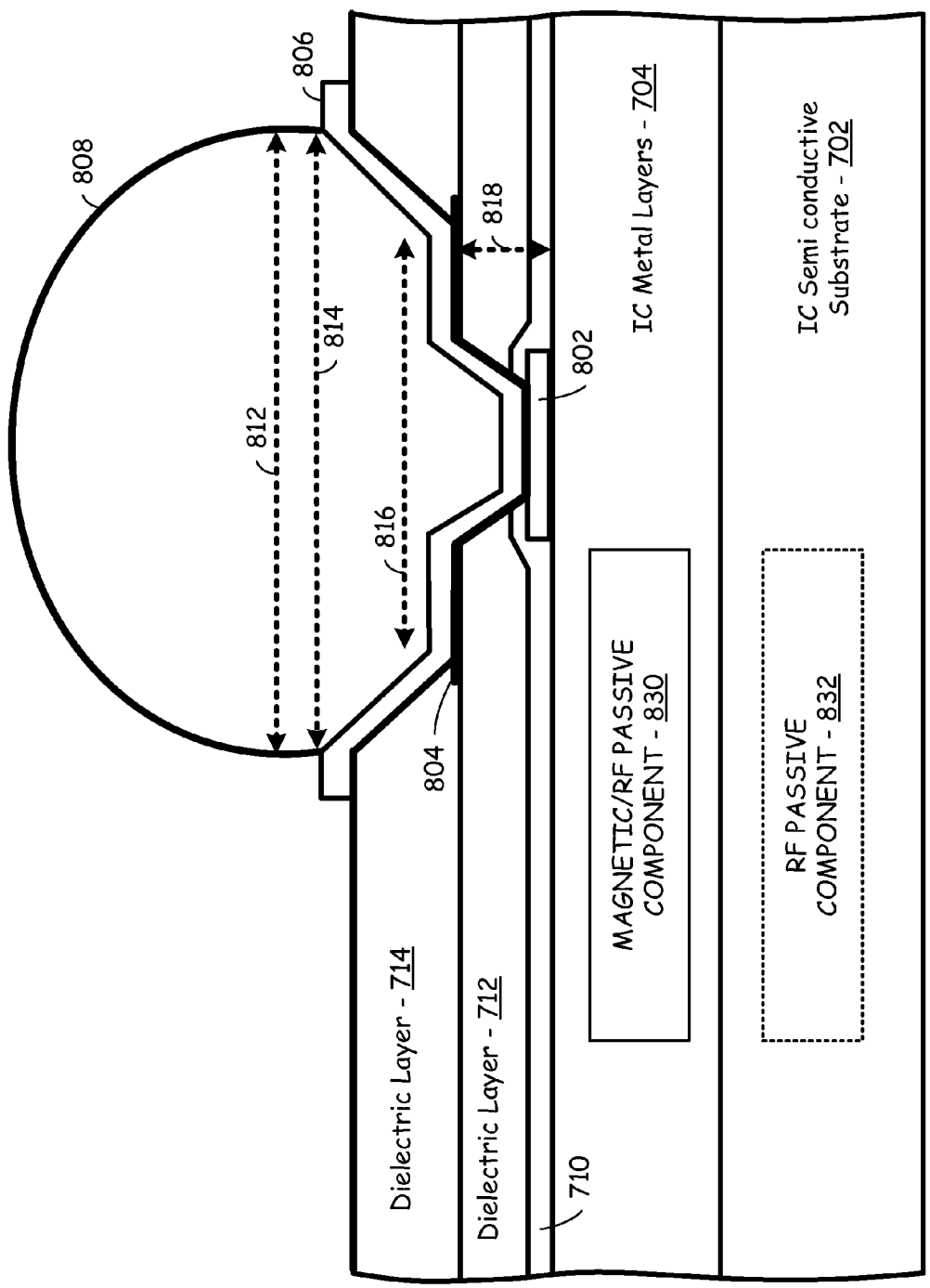
FIG. 8 is a diagrammatic sectional side view illustrating another portion of the integrated circuit package constructed according to an embodiment of the present invention.

FIG. 8 is a diagrammatic sectional side view illustrating another portion of the integrated circuit package constructed according to an embodiment of the present invention. As distinguished from the construct of FIG. 7, the construct of FIG. 8 includes a bump/ball 808 that resides substantially above signal pad 802. The combined thickness of dielectric layer 712 and dielectric layer 710 (distance 818) provides isolation between the RDL 804 and IC metal layers 704. The thickness of dielectric layer 714 provides further isolation between a surface of the packaged IC and metal layers 704. According to one embodiment of the present invention, a combined thickness of dielectric layers 710, 712, and 714 has a minimum thickness. Using processing techniques available at the time of filing of this application, this thickness is at least ten (10) micrometers (μm). As is shown, the bump/ball has a diameter 812, a diameter 814 at the top of UBM 806, and a diameter 816 at its base.

As was also the case with the structure of FIG. 7, magnetic/RF passive component(s) 830 are formed in IC Metal Layers 704 and RF passive component(s) 832 may be formed in the IC semi conductive substrate 702. Further, as was the case with the structure of FIG. 7, package signal connection (ball 808) at least partially overlays the RF passive components 830 and/or 832.

Figure 9:
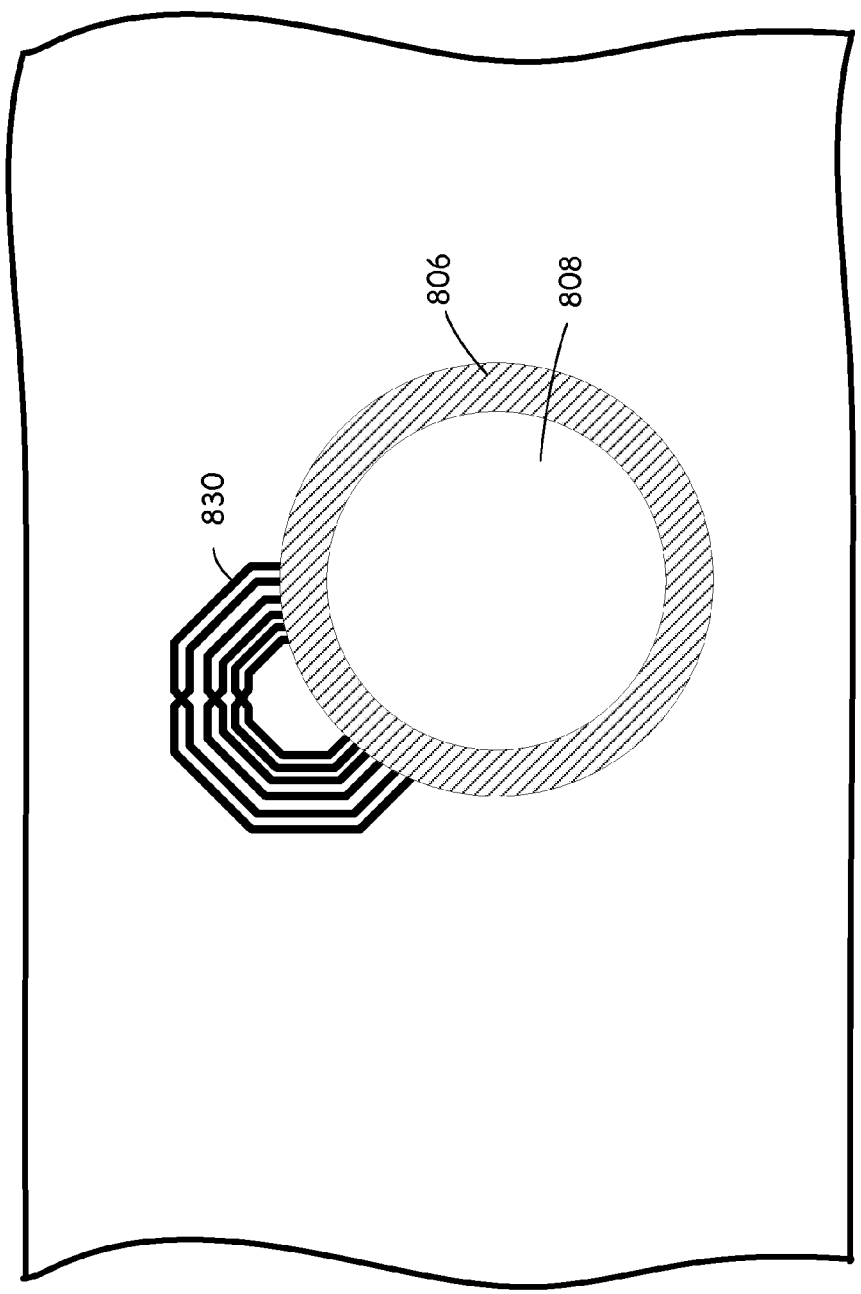
FIG. 9 is a transparent diagrammatic top view of a portion of an integrated circuit package constructed according to an embodiment of the present invention.

FIG. 9 is a transparent diagrammatic top view of a portion of an integrated circuit package constructed according to an embodiment of the present invention. As is shown, bump/ball/pad 808 (formed upon UBM 806) has a cross-sectional area with respect to surface of the IC and package. Further, the UBM 806 also has a cross-sectional area with respect to a surface of the IC and package. Also shown in FIG. 9 is a magnetic/RF passive component 830. Particularly, the magnetic/RF passive component 830 of FIG. 9 is an inductor. In another embodiment, the magnetic/RF passive component 830 of FIG. 9 is a transformer. In still other embodiments, the magnetic/RF passive component 830 may be a capacitor, resistor, or other circuit element. The RF passive component may be formed in IC metal layers 704 and/or in IC semi conductive substrate 702.

As shown in FIG. 9, the package signal connection, which services a signal, power, or ground connection (shown as ball 808 but, which may also be a bump or pad) at least partially overlays the RF passive component(s) 830. Because of this overlay, interference of operation of the package signal connection 808 with the RF passive component 830 may occur. In order to prevent undesirable operational effect due to this overlay, the amount of the overlay may be selected. For example, a percentage overlay limit may be incorporated when determining the layout of the RF passive component 830 and the package signal connection 808. Alternatively, circuits that could be affected by this overlay may be designed accordingly in anticipation by the effect of the overlay.

Figure 10:
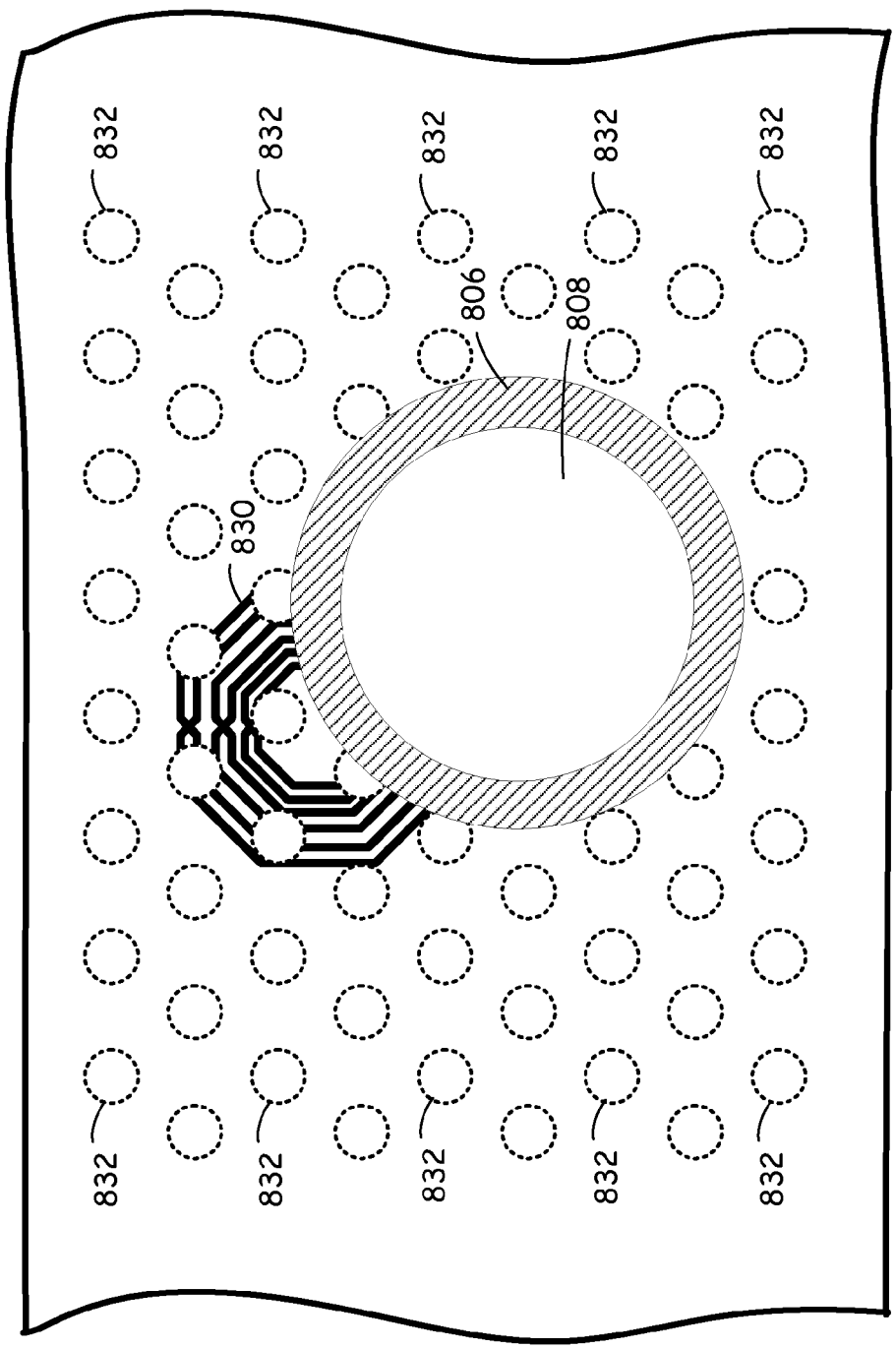
FIG. 10 is a transparent diagrammatic top view of a portion of an integrated circuit package constructed according to an embodiment of the present invention.

FIG. 10 is a transparent diagrammatic top view of a portion of an integrated circuit package constructed according to an embodiment of the present invention. As contrasted to the structure of FIG. 9, the structure of FIG. 10 includes a pattern of conductive elements 832 that are formed upon dielectric layer 714 (referring to FIG. 8), for example. This pattern of conductive elements 832 reduce the effect that the package signal connection 808 has on the underlying RF passive component 830.

Figure 11:
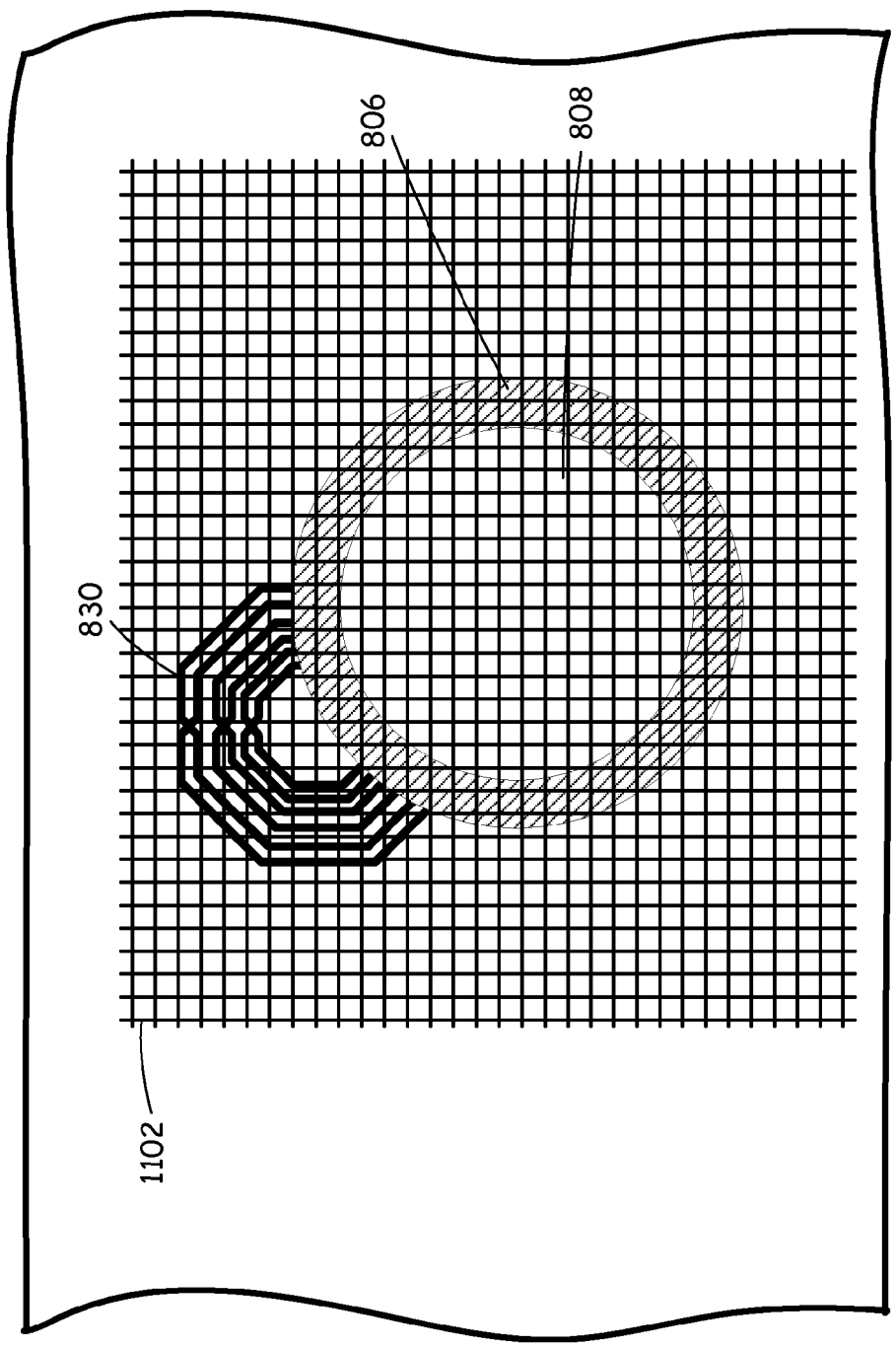
FIG. 11 is a transparent diagrammatic top view of a portion of an integrated circuit package constructed according to an embodiment of the present invention.

FIG. 11 is a transparent diagrammatic top view of a portion of an integrated circuit package constructed according to an embodiment of the present invention. As contrasted to the structure of FIG. 9, the structure of FIG. 11 includes a conductive grid 1102 that is formed upon dielectric layer 714 (referring to FIG. 8), for example. This conductive grid 1102 reduces the effect that the package signal connection 808 has on the underlying RF passive component 830.

Figure 12:
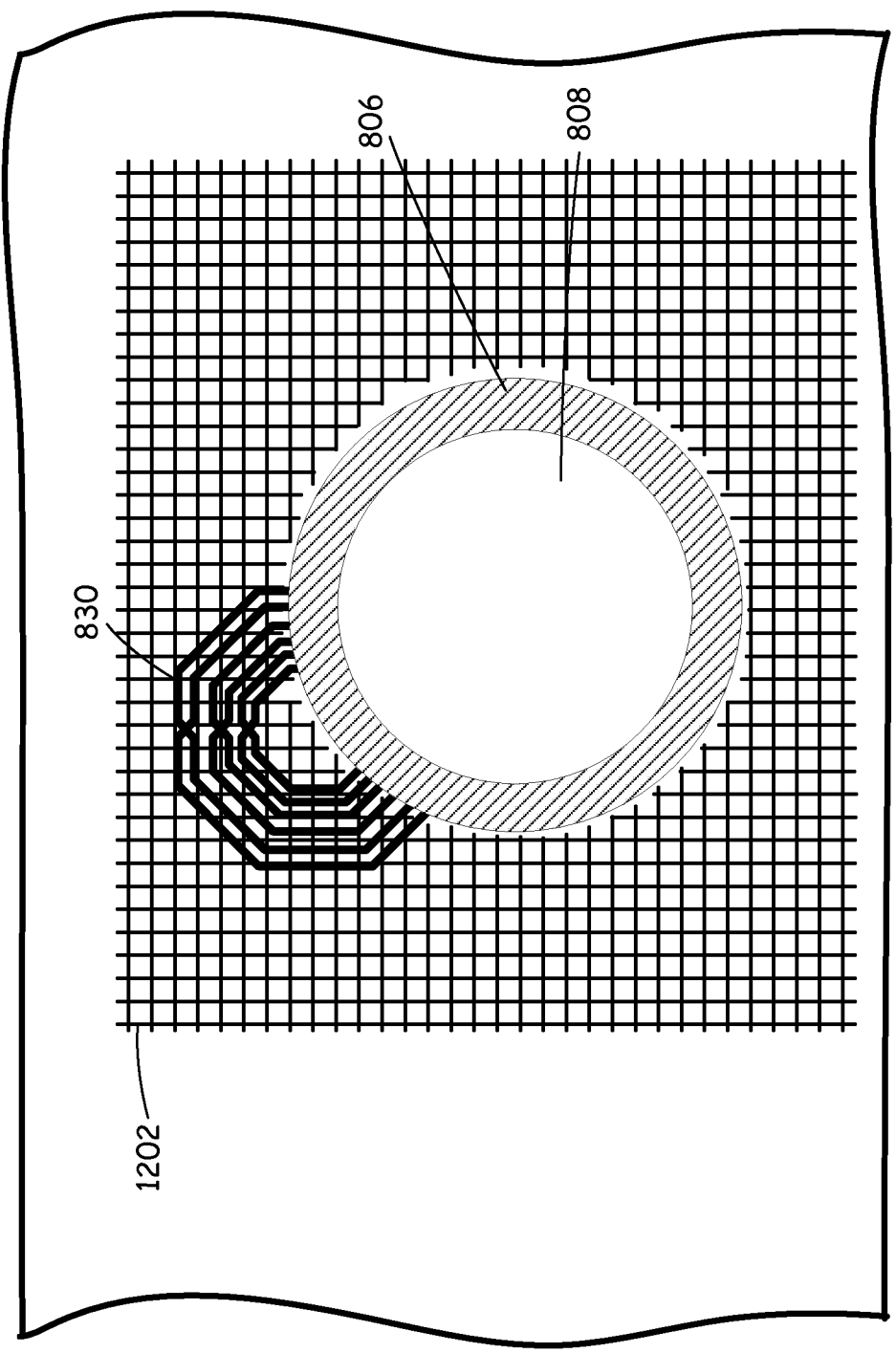
FIG. 12 is a transparent diagrammatic top view of a portion of an integrated circuit package constructed according to an embodiment of the present invention.

FIG. 12 is a transparent diagrammatic top view of a portion of an integrated circuit package constructed according to an embodiment of the present invention. As contrasted to the structure of FIG. 9, the structure of FIG. 11 includes a conductive grid 1202 that is formed upon dielectric layer 714 (referring to FIG. 8), for example. This conductive grid 1202 reduces the effect that the package signal connection 808 has on the underlying RF passive component 830. As contrasted to the structure of FIG. 11, the grid 1202 of FIG. 12 has an opening formed therein for the ball 808 and UBM 808.

With respect to FIGS. 11 and 12, the grid pattern(s) or other patterns of conductors may also be used to improve isolation of circuitry and/or to distribute power to components of the underlying integrated circuit.

FIG. 13 is a flow chart illustrating a method for constructing a wafer-level chip scale flip chip package according to another embodiment of the present invention. Operation commences in determining the isolation requirements of a plurality of ICs formed in a semi conductive die (Step 1302). Operation continues in determining the parasitic circuit component limitations of each of the plurality of ICs formed in the semi conductive die (Step 1304). Then, operation includes selecting a thickness of at least one dielectric layer that isolates a top metal layer of the IC die from package signal connections of the package (Step 1306). Operation then continues with selecting locations of package signal connections above RF passive components for at least partial overlap (Step 1308). Operation continues in selecting conductive structure(s) to reduce the effects of package signal connection(s) to underlying RF passive components (Step 1310). Operation concludes with packaging the IC die in the wafer-level chip scale flip chip package formed according to Steps 1302-1310 (Step 1312).

As one of average skill in the art will appreciate, the term "communicatively coupled," as may be used herein, includes wireless and wired, direct coupling and indirect coupling via another component, element, circuit, or module. As one of average skill in the art will also appreciate, inferred coupling (i.e., where one element is coupled to another element by inference) includes wireless and wired, direct and indirect coupling between two elements in the same manner as "communicatively coupled."

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A packaged integrated circuit comprising:
    an integrated circuit having a Radio Frequency (RF) passive element formed therein; and
    a wafer level chip scale flip chip package that contains the integrated circuit and that comprises:
        at least one dielectric layer isolating a top metal layer of the integrated circuit;
        a package signal connection upon the at least one dielectric layer, wherein the package signal connection partially overlaps the RF passive element with respect to a surface of the integrated circuit, and wherein the amount of overlap is limited to a predetermined percentage overlay limit; and
        a redistribution layer electrically coupled to the package signal connection and the top metal layer.

2. The packaged integrated circuit of claim 1, wherein the RF passive element comprises an inductor.

3. The packaged integrated circuit of claim 1, wherein the RF passive element comprises a transformer.

4. The packaged integrated circuit of claim 1, wherein the RF passive element comprises a capacitor.

5. The packaged integrated circuit of claim 1, wherein the package signal connection comprises a conductive ball.

6. The packaged integrated circuit of claim 1, wherein the package signal connection comprises a conductive bump.

7. The packaged integrated circuit of claim 1, wherein the package signal connection comprises a conductive spring.

8. The packaged integrated circuit of claim 1, further comprising a conductive structure residing upon the at least one dielectric layer.

9. The packaged integrated circuit claim 8, wherein the conductive structure comprises a plurality of conductive elements.

10. A wireless device comprising:
   a housing;
   an antenna;
   a user interface; and
   a packaged integrated circuit contained in the housing and coupled to at least one of the antenna and the user interface, the packaged integrated circuit comprising:
      an integrated circuit having a Radio Frequency (RF) passive element formed therein; and
      a wafer level chip scale flip chip package that contains the integrated circuit and that comprises:
         at least one dielectric layer isolating a top metal layer of the integrated circuit;
         a package signal connection upon the at least one dielectric layer, wherein the package signal connection partially overlaps the RF passive element with respect to a surface of the integrated circuit, and wherein the amount of overlap is limited to a predetermined percentage overlay limit; and
         a redistribution layer electrically coupled to the package signal connection and the top metal layer.

11. The wireless device of claim 10, wherein the RF passive element comprises an inductor.

12. The wireless device of claim 10, wherein the RF passive element comprises a transformer.

13. The wireless device of claim 10, wherein the RF passive element comprises a capacitor.

14. The wireless device of claim 10, wherein the package signal connection comprises a conductive ball.

15. The wireless device of claim 10, wherein the package signal connection comprises a conductive bump.

16. The wireless device of claim 10, wherein the package signal connection comprises a conductive spring.

17. The wireless device of claim 10, further comprising a conductive structure residing upon the at least one dielectric layer.

18. The wireless device of claim 17, wherein the conductive structure comprises a plurality of conductive elements.

19. The wireless device of claim 10, further comprising an under bump metallization (UBM) layer.

20. A packaged integrated circuit comprising:
   an integrated circuit having a Radio Frequency (RF) passive element formed therein; and
   a wafer level chip scale flip chip package that contains the integrated circuit and that comprises:
      at least one dielectric layer isolating a top metal layer of the integrated circuit;
      a package signal connection upon the at least one dielectric layer, wherein the package signal connection partially overlaps the RF passive element with respect to a surface of the integrated circuit, and wherein the amount of overlap is limited to a specified maximum overlay amount;
      a redistribution layer electrically coupled to the package signal connection and the top metal layer; and
      an under bump metallization (UBM) layer.

* * * * *